United States Patent [19]

Teherani et al.

[11] Patent Number: 4,632,886

[45] Date of Patent: Dec. 30, 1986

[54] SULFIDIZATION OF COMPOUND SEMICONDUCTOR SURFACES AND PASSIVATED MERCURY CADMIUM TELLURIDE SUBSTRATES

[75] Inventors: Towfik H. Teherani, Plano; Arturo Simmons, Garland, both of Tex.

[73] Assignee: Texas Instruments Incorporated, Dallas, Tex.

[21] Appl. No.: 656,057

[22] Filed: Sep. 28, 1984

[51] Int. Cl.[4] ............................ B32B 9/00; C25D 9/06
[52] U.S. Cl. .................................... 428/698; 204/34.5; 204/56.1; 357/52; 357/61; 428/699
[58] Field of Search ................... 427/87; 428/698, 699; 357/52, 61; 148/DIG. 64; 204/34.5, 56 R, 58.5

[56] References Cited

U.S. PATENT DOCUMENTS

| | | | |
|---|---|---|---|
| 3,573,177 | 3/1971 | McNeill | 204/56 R X |
| 3,799,803 | 3/1974 | Kraus et al. | 357/61 X |
| 3,977,018 | 8/1976 | Catagnus et al. | 204/56 R X |
| 4,137,544 | 1/1979 | Koehler | 357/52 X |
| 4,320,178 | 3/1982 | Chemla et al. | 428/698 |
| 4,376,016 | 3/1983 | Fawcett et al. | 204/58.5 |

*Primary Examiner*—G. L. Kaplan
*Attorney, Agent, or Firm*—Carlton H. Hoel; Robert O. Groover; James T. Comfort

[57] ABSTRACT

The disclosure relates to a method of passivating mercury cadmium telluride substrates wherein a substrate surface is lapped and cleaned and then placed in an electrolyte solution containing sulfide ions to electrolytically grow a sulfide passivating layer on the lapped and cleaned surface. A preferred electrolyte solution is formed with sodium sulfide, water and ethylene glycol.

16 Claims, 3 Drawing Figures

SULFIDIZATION OF COMPOUND SEMICONDUCTOR SURFACES AND PASSIVATED MERCURY CADMIUM TELLURIDE SUBSTRATES

BACKGROUND OF THE INVENTION

1. Field of the Invention

This invention relates to methods of passivation of compound semiconductors and, more specifically, to passivation of mercury cadmium telluride semiconductor material.

2. Brief Description of the Prior Art

In the fabrication of semiconductor devices, such as those of silicon and gallium arsenide, passivation is obtained by the formation of thermal oxides or nitrides of the substrate material. Such thermal oxides cannot be grown on mercury cadmium telluride substrates due to the vapor pressure of the mercury and the concommitant mercury loss at the surface of the material at elevated temperatures. Accordingly, in the fabrication of infrared detectors utilizing mercury cadmium telluride semiconductor material, surface passivation takes place by the non-thermal growth of oxide on the mercury cadmium telluride surface, such oxides having been grown in an electro-chemical reaction known as anodization. These oxides are found to be relatively unstable at slightly elevated temperatures in the range of about 100 degrees C. in that the anodic oxide/substrate interface has been found to be a problem source leading to degradation and device performance fluctuations at such temperatures. Degradation caused from normal shelf life even at room temperature is found to exist. It has therefore been necessary that mercury cadmium telluride infrared devices be maintained at low temperatures in order to maintain the oxide stable, such temperatures being in the range of liquid nitrogen temperatures in a vacuum or at about 80 degrees Kelvin. It can therefore readily be seen that, not only does the oxide passivation layer cause problems relative to device degradation, but, in addition, in order to maintain proper device action, costly techniques must be utilized. It is therefore the desire of the art to obtain devices with the properties of mercury cadmium telluride infrared detectors which can overcome the problems enumerated above.

SUMMARY OF THE INVENTION

In accordance with the present invention, the above problems with the prior art are overcome and there is provided a method for forming a passivation layer on mercury cadmium telluride semiconductor materials which is stable at normally encountered operating temperatures, especially in the range of room temperature to 100 degrees C. and which can be utilized without the expensive and cumbersome equipment for maintaining temperatures at 80 degrees Kelvin as described hereinabove. Briefly, the above is accomplished by providing a mercury cadmium telluride substrate, lapping the surface thereof and polishing the surface to remove approximately two mils of the material in standard manner. The standard surface cleanup of the prior art is then provided to result in a clean surface. The substrate is then placed in an electrolyte solution containing sulfide ions at preselected voltage and current flow characteristics for predetermined amount of time, the voltage, current, electrolyte concentration and time of electrolysis being a function of the thickness of the sulfide layer to be formed on the surface of the mercury cadmium telluride substrate. The result is that a passivation layer of mercury sulfide, cadmium sulfide and tellurium sulfide is formed as a combination which is stable at the normal operating temperatures of room temperature to 100° C. as described hereinabove. Briefly, the above is accomplished by providing a mercury cadmium telluride substrate, lapping the surface thereof and polishing the surface to remove aoproximately two mils of the material in standard manner. The standard surface cleanup of the prior art is then provided to result in a clean surface. The substrate is then placed in an electrolyte solution containing sulfide ions at preselected voltage and current flow characteristics for predetermined amount of time, the voltage, current, electrolyte concentration and time of electrolysis being a function of the thickness of the sulfide layer to be formed on the surface of the mercury cadmium telluride substrate. The result is that a passivation layer of mercury sulfide, cadmium sulfide and tellurium sulfide is formed as a combination which is stable at the normal operating temperatures of room temperature to 100 degrees C. and does not require a liquid nitrogen bath to maintain stability of the passivation layer.

BRIEF DESCRIPTION OF THE DRAWING

The Figures are schematic diagrams of the processing steps utilized to form a sulfide passivation layer in accordance with the present invention.

Figure 1A:
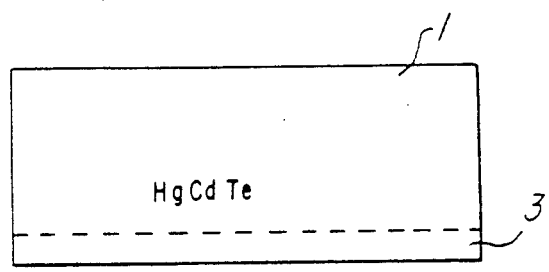
Referring now to FIG. 1a, there is shown a mercury cadmium telluride substrate of standard type 1 which is to be passivated. The substrate 1 is shown epoxied to a sapphire substrate 3 in a standard manner. The surface of the substrate 1 is then lapped and polished to remove approximately two mils of the material at 5 as shown in FIG. 1b. The lapped and polished substrate 1 is then secured to the positive terminal of a variable voltage source 13 with the negative terminal disposed in an electrolyte bath 7 with electrolyte 9 therein placed in the electrolyte bath 7 as shown in FIG. 1c. The electrolyte 9 contains sulfide ions whereby a sulfide layer 11 is grown on the surface of the substrate 1 which was polished. The electrolyte bath 9 preferably has a combination of sodium sulfide, water and ethylene glycol. A preferred formulation has been found to be 14.2 grams sodium sulfide, 200 milliliters water, and 800 milliliters of ethylene glycol. A preferred voltage across the battery 13 has been found to be 0.6 volts with current flowing at 100 microamperes, this combination when utilized for 20 minutes, having been found to provide a sulfide film of 200 Angstroms on a surface 0.5 centimeters on each side. A preferred electrolysis time is 20 to 40 minutes in which time a sulfide layer in the range of 150 to 300 Angstroms will be formed. The voltage of the battery 13, the current density and the concentration of the electrolyte 9 and the time period during which electrolysis takes place will all be factors which will determine the thickness of the sulfide layer 11.
Figure 1B:
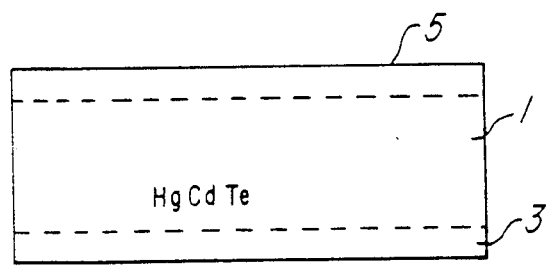
Figure 1C:
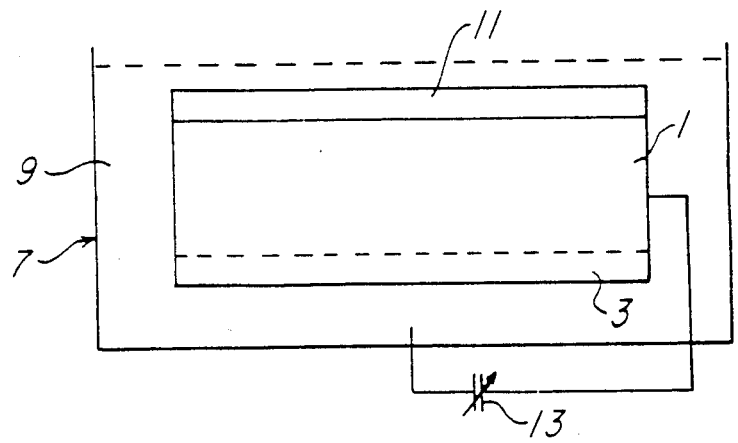

It can be seen that there is provided a mercury cadmium telluride semiconductor material which has been passivated by material which is stable under normal operating conditions relative to prior art passivation layers and which is easily formed on the mercury cadmium telluride substrate at relatively low cost.

Although the invention has been described with respect to a specific preferred embodiment, many variations and modifications will immediately become apparent to those skilled in the art. It is therefore the intention that the appended claims be interpreted as broadly as possible in view of the prior art to include all such variations and modifications.

We claim:

1. A method of passivating a mercury cadmium telluride substrate, comprising the steps of:
   (a) providing a mercury cadmium telluride substrate,
   (b) cleaning a surface of said substrate; and
   (c) anodically growing a sulfide layer on the cleaned surface of said substrate.

2. A method as set forth in claim 1 wherein step (c) is formed by providing an electrochemical bath having sulfide ions therein.

3. A method as set forth in claim 2 wherein said bath includes ethylene glycol therein.

4. A method of passivating a mercury cadmium telluride substrate, comprising the steps of:
   (a) providing a mercury cadmium telluride substrate,
   (b) cleaning a surface of said substrate, and
   (c) anodically growing a sulfide layer with components of said substrate at said cleaned surface.

5. A method as set forth in claim 4 wherein the anodic growth comprises providing an electrolyte having sulfide ions therein, connecting a voltage source between said electrolyte and said substrate and placing the substrate with said voltage source connected thereto into said electrolyte.

6. A method as set forth in claim 5 wherein the positive terminal of said voltage source is secured to said substrate and the negative terminal of said voltage source is disposed in said electrolyte remove from said substrate.

7. A method as set forth in claim 6 wherein said electrolyte comprises a water soluble sulfide and water.

8. A method as set forth in claim 7 wherein said soluble sulfide is sodium sulfide.

9. A method as set forth in claim 7 wherein said electrolyte further includes ethylene glycol.

10. A method as set forth in claim 8 wherein said electrolyte further includes ethylene glycol.

11. A method as set forth in claim 5 wherein said electrolyte comprises a water soluble sulfide and water.

12. A method as set forth in claim 11 wherein said soluble sulfide is sodium sulfide.

13. A method as set forth in claim 12 wherein said electrolyte further includes ethylene glycol.

14. A method as set forth in claim 11 wherein said electrolyte further includes ethylene glycol.

15. A passivated mercury cadmium telluride substrate which comprises:
   (a) a mercury cadmium telluride substrate; and
   (b) a layer of a sulfide on a surface of said substrate formed with components of said substrate.

16. A passivated substrate as set forth in claim 15 wherein said layer of sulfide is a mixture of mercury sulfide, cadmium sulfide and tellurium sulfide.

* * * * *